(12) United States Patent
Taubert et al.

(10) Patent No.: US 9,894,786 B2
(45) Date of Patent: Feb. 13, 2018

(54) SHEET METAL HOUSING FOR AN ELECTRONIC CONTROLLING UNIT

(71) Applicant: CONTINENTAL AUTOMOTIVE GMBH, Hannover (DE)

(72) Inventors: Sebastian Taubert, Timisoara (RO); Adrian Harea, Timisoara (RO)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/456,984

(22) Filed: Mar. 13, 2017

(65) Prior Publication Data

US 2017/0265318 A1  Sep. 14, 2017

(30) Foreign Application Priority Data

Mar. 14, 2016 (EP) .................................... 16465508

(51) Int. Cl.
| | |
|---|---|
| *H05K 5/02* | (2006.01) |
| *H05K 5/04* | (2006.01) |
| *H05K 5/03* | (2006.01) |
| *H01R 27/02* | (2006.01) |
| *B60R 16/023* | (2006.01) |
| *H05K 5/00* | (2006.01) |

(52) U.S. Cl.
CPC ....... *H05K 5/0217* (2013.01); *B60R 16/0239* (2013.01); *H01R 27/02* (2013.01); *H05K 5/0073* (2013.01); *H05K 5/0204* (2013.01); *H05K 5/0247* (2013.01); *H05K 5/03* (2013.01); *H05K 5/04* (2013.01)

(58) Field of Classification Search
CPC ........................... H05K 5/0073; H05K 5/0204
See application file for complete search history.

(56) References Cited

U.S. PATENT DOCUMENTS

| | | | |
|---|---|---|---|
| 6,717,051 B2* | 4/2004 | Kobayashi | .......... B60R 16/0239 174/535 |
| 8,389,875 B2* | 3/2013 | Sakakieda | ............ H05K 5/0204 174/535 |
| 2008/0245544 A1 | 10/2008 | Warren et al. | |
| 2008/0310124 A1* | 12/2008 | Tu | ........................ H05K 5/0204 361/728 |

(Continued)

FOREIGN PATENT DOCUMENTS

| | | |
|---|---|---|
| DE | 102005036300 A1 | 2/2007 |
| DE | 102010007651 A1 | 10/2011 |

(Continued)

*Primary Examiner* — Hung V Ngo
(74) *Attorney, Agent, or Firm* — Laurence A. Greenberg; Werner H. Stemer; Ralph E. Locher

(57) ABSTRACT

A sheet metal housing for an electronic controlling unit of a car is fixable in a holding element of the car. The housing has a first housing edge and a second housing edge arranged at opposite sides of the housing. First and second mounting elements are arranged at the first and second housing edges, respectively. The first and second mounting elements each comprise a first, a second and a third contact face for contacting the holding element to fix the housing in the holding element. The first contact face being arranged at a lower side, the second contact face being arranged at an outer side, and the third contact face being arranged at an upper side.

16 Claims, 6 Drawing Sheets

(56) References Cited

U.S. PATENT DOCUMENTS

| | | | |
|---|---|---|---|
| 2010/0253188 A1* | 10/2010 | Koyama | H05K 5/0073 312/223.1 |
| 2011/0085307 A1* | 4/2011 | Burgi | H05K 5/0073 361/752 |
| 2011/0310574 A1* | 12/2011 | Nomoto | H05K 5/0073 361/752 |
| 2012/0026703 A1* | 2/2012 | Nomoto | H05K 5/0073 361/752 |
| 2012/0037415 A1* | 2/2012 | Demma | B60R 16/0239 174/480 |
| 2012/0261409 A1* | 10/2012 | Teteak | H05K 5/0073 220/4.02 |
| 2014/0014794 A1* | 1/2014 | Koyama | B60R 11/00 248/205.1 |
| 2014/0062271 A1 | 3/2014 | Warren et al. | |
| 2015/0155724 A1 | 6/2015 | Han et al. | |
| 2015/0176759 A1* | 6/2015 | Morris | F16M 11/041 248/346.04 |

FOREIGN PATENT DOCUMENTS

| | | |
|---|---|---|
| DE | 102011014424 A1 | 11/2011 |
| DE | 102012003617 A1 | 8/2013 |
| DE | 102013222962 A1 | 5/2014 |
| FR | 2996885 A1 | 4/2014 |
| WO | 2014036087 A1 | 3/2014 |

\* cited by examiner

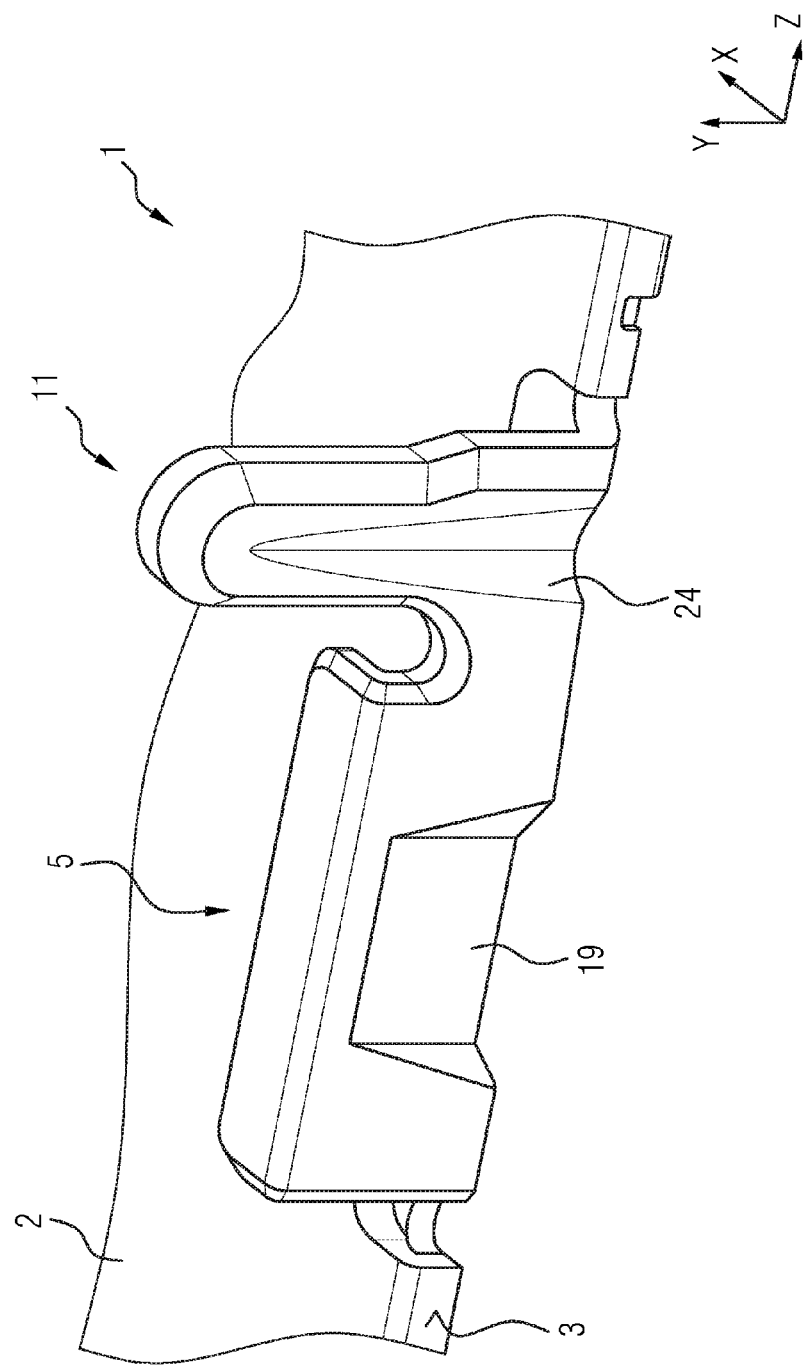

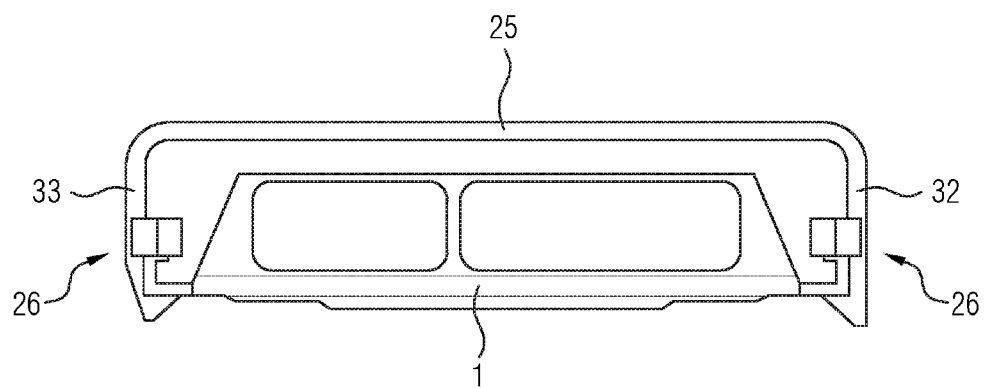
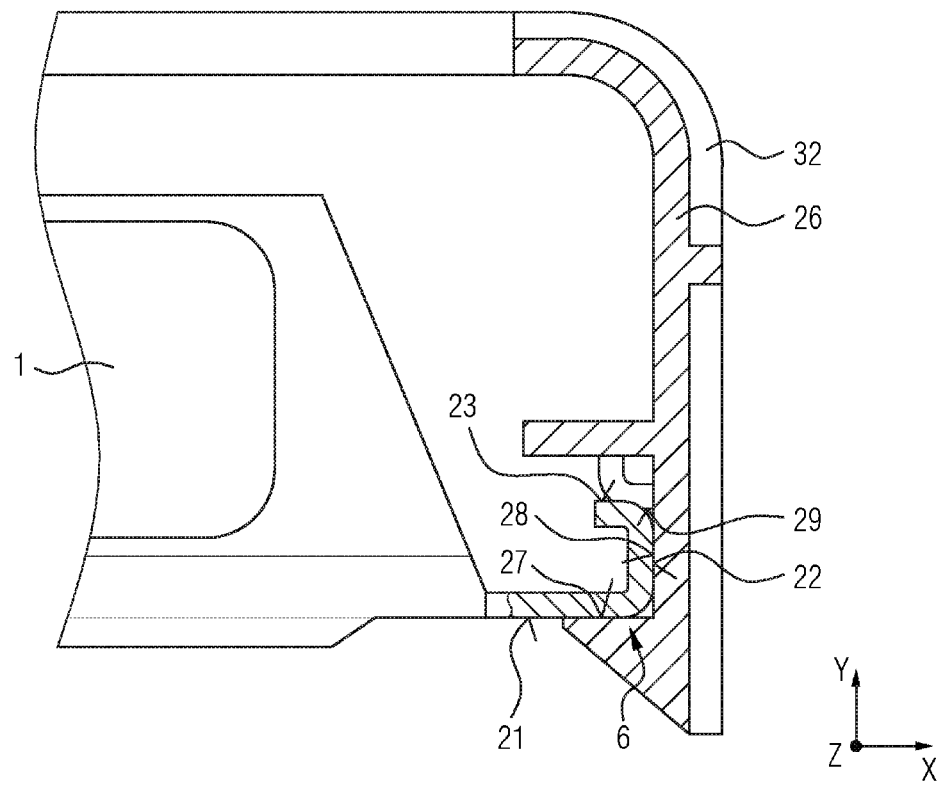

SHEET METAL HOUSING FOR AN ELECTRONIC CONTROLLING UNIT

CROSS-REFERENCE TO RELATED APPLICATION

This application claims the priority, under 35 U.S.C. § 119, of European application EP 16465508, filed Mar. 14, 2016; the prior application is herewith incorporated by reference in its entirety.

BACKGROUND OF THE INVENTION

Field of the Invention

The present disclosure refers to a sheet metal housing for an electronic controlling unit, in particular of a car.

In the state of the art electronic controlling units contains a housing that is embodied as a die cast housing.

SUMMARY OF THE INVENTION

It is an object of the present disclosure to provide an improved housing for an electronic controlling unit of a car, in particular a sheet metal housing which has particularly small weight and/or can be produced particularly easily.

According to one aspect, a sheet metal housing for an electronic controlling unit is disclosed. According to a second aspect, an electronic controlling unit with the sheet metal housing is disclosed. The electronic controlling unit is in particular an electronic controlling unit of a car, i.e. in particular a motor vehicle.

Preferably, the housing is fixable in a holding element of the car. The holding element is in particular positionally fixed with respect to the car, in particular with respect to the body of the car. The housing may expediently be releasably fixable with the holding element. In a fixed configuration, the housing and the holding element are positionally fixed relative to one another.

The housing has a first housing edge and a second housing edge, the first housing edge and the second housing edge being arranged at opposite sides of the housing. In particular, the first and second housing edges span a main plane of extension of the housing. The first and second housing edges preferably extend parallel to one another.

The housing further contains first and second mounting elements. The first mounting element is arranged at the first housing edge and the second mounting element is arranged at the second housing edge. The first and the second mounting element each comprise a first, a second and a third contact face.

The first, the second and the third contact face of the housing are in particular provided to fix the housing at the holding element. Specifically, the contact faces may be configured for contacting the holding element to fix the housing in the holding element.

The first contact face is arranged at a lower side, the second contact face is arranged at an outer side, and the third contact face is arranged at an upper side opposite to the lower side. In other words, the first and third faces face in opposite direction and are preferably parallel to the main plane of extension. The second face faces laterally outward, i.e. in particular away from the second housing edge in case of the first mounting element and away from the first housing edge in case of the second mounting element. Preferably, the second face is perpendicular or at least inclined with respect to the main plane of extension.

With advantage, the sheet metal housing can be easily fixed to the holding element. In particular, it can be easily shifted into the holding element in direction along the first and second edges. The mounting elements have a simple design and light elements for mounting the housing securely to the holding element.

In a further embodiment a third mounting element is provided at the first housing edge and a fourth mounting element is provided at the second housing edge. The third and the fourth mounting element also contain a first, a second and a third contact face that can be used for mounting the housing to the holding element. Specifically, the contact faces may be configured for contacting the holding element to fix the housing in the holding element and the first, second and third contact faces are arranged at a lower side, an outer side, and an upper side as discussed above.

With advantage, at each first and second housing edge two mounting elements are provided which are arranged at a given distance in this way. Therefore the mounting of the housing to the holding element is improved. The third and the fourth mounting element provide an improved fixing of the housing.

In a further embodiment the first and the second mounting element are arranged at opposite sides of the housing at a same first length position and the third and the fourth mounting element are arranged at opposite sides of the housing at a same second length position. In other words, the housing may have a third edge, connecting the first and second edges. The first and second mounting elements may have the same first distance from the third edge. The third and fourth mounting elements, if present, may have the same second distance from the third edge, the second distance being different from the first distance, in particular by a value greater than the dimensions of each of the mounting elements in direction along the first and second edges.

Therefore a secure fixing of the housing can be advantageously attained and the holding forces are equally distributed.

In a further embodiment a positioning tab is provided at the first and/or at the second housing edge, wherein the positioning tab projects above the first and/or the second mounting element along a height axis of the housing. The height axis is in particular a direction perpendicular to the main plane of extension.

While the mounting elements in particular are operable to fix the housing with respect to the holding element direction perpendicular to the main plane of extension and in direction perpendicular to the first and second edges, the positioning tab may be configured to engage with the holding element for fixing the housing in direction along the first and second edges. Preferably, the housing is insertable into the holding element in direction along the first and second edges and the positioning tab is shaped and position to fix the housing with the holding element when the housing has reached its final position in the holding element.

In a further embodiment the positioning tab is manufactured integrally with the first or the second mounting element, i.e. it is in one piece with the respective mounting element. For example it is positioned at an end of the first or second mounting element facing away from the third or fourth mounting element, respectively. Therefore particularly little space is necessary and the positioning tab has a particularly stable shape.

In a further embodiment at least one of the mounting elements is made of sheet metal. The sheet metal can be easily machined, provides high mechanical stability with low weight. At least one mounting element may be in one part with a sheet metal of the housing. Therefore it is not necessary to fix the mounting element to the sheet metal of the housing. As a result the housing has a simple structure. Additionally the mounting element is tightly fixed to the sheet metal.

In a further embodiment the mounting element is part of a sheet metal base plate of the housing. The base plate preferably has a generally planar main portion which is in particular parallel to the main plane of extension of the housing. The mounting elements preferably merge with the main portion. Particularly preferably, the mounting elements are shaped as protrusions protruding from the main portion in a direction perpendicular to the main plane of extension.

In this way, the mounting element is advantageously fixed with a large part of the housing. This embodiment provides a secure and stable fixing of the mounting element.

In one embodiment, the housing contains a cover. The cover may be generally trough shaped so that it is configured for receiving a circuit board and electric and/or electronic components of the electronic controlling unit. The cover is preferably a sheet metal cover. The cover and the base plate in particular constitute the housing, preferably together with one or more electrical connectors which may in particular close one or more openings of the cover and/or the base plate. Fixing of the sheet metal cover by crimping to the base plate can be easily performed, in particular due to the presence of the spaced apart mounting elements.

In a further embodiment, the mounting element contains a stiffening that is made by a press-in area. To put it differently, the mounting elements may comprise one or more recesses extending into the respective mounting element. In particular the respective recess extends laterally—i.e. parallel to the main plane of extension and perpendicular to the first and second edge—into the respective mounting element. A press-in area can be simply machined in sheet metal and provides an increase in the stability of the mounting element. Therefore the sheet metal can be embodied with a particularly small thickness.

In a further embodiment a first and a second rim are arranged between the first and the second mounting element and a main body of the housing. The first and the second rim have a lower height than the main body and have a lower height than the first and second mounting element. The rims may be constituted by border portions of the base plate and the cover which extend along each of the first and second edges, the respective border portion of the base plate contacting the respective border portion of the cover. The mutually contacting border portions are preferably coplanar sheet metal portions, preferably also being coplanar with the main plane of extension. Between the border portions adjacent to the first and second edges, respectively, the cover and the base plate may expediently be spaced apart from one another, in particular due to the trough shape of the cover, to define the main body of the housing. In this way, the cover and the base plate shape an interior space for accommodating the circuit board and the electronic components in the region of the main body. The height of the first and second rims is in particular the dimension of the border portions perpendicular to the main plane of extension.

By means of the rim portions, there is enough space at the first and the second housing edge to connect the first and the second mounting element with corresponding mounting device of the holding element. The first and second rim provide plane faces for an improved sealing of the housing.

Other features which are considered as characteristic for the invention are set forth in the appended claims.

Although the invention is illustrated and described herein as embodied in a sheet metal housing for an electronic controlling unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 4 is a schematic perspective view of a first mounting element with a positioning tab;

FIG. 5 is a schematic view of the electronic controlling unit that is fixed to a holding element;

FIG. 6 is a partial schematic cross-section of the mounting element and a part of the holding element;

DETAILED DESCRIPTION OF THE INVENTION

In the exemplary embodiments and figures, identical, similar or similarly acting constituent parts are provided with the same reference symbols. In some figures, individual reference symbols may be omitted to improve the clarity of the figures. The elements illustrated in the figures and their size relationships among one another should not be regarded as true to scale. Rather, individual elements may be represented with an exaggerated size for the sake of better representability and/or for the sake of better understanding.

Figure 1:
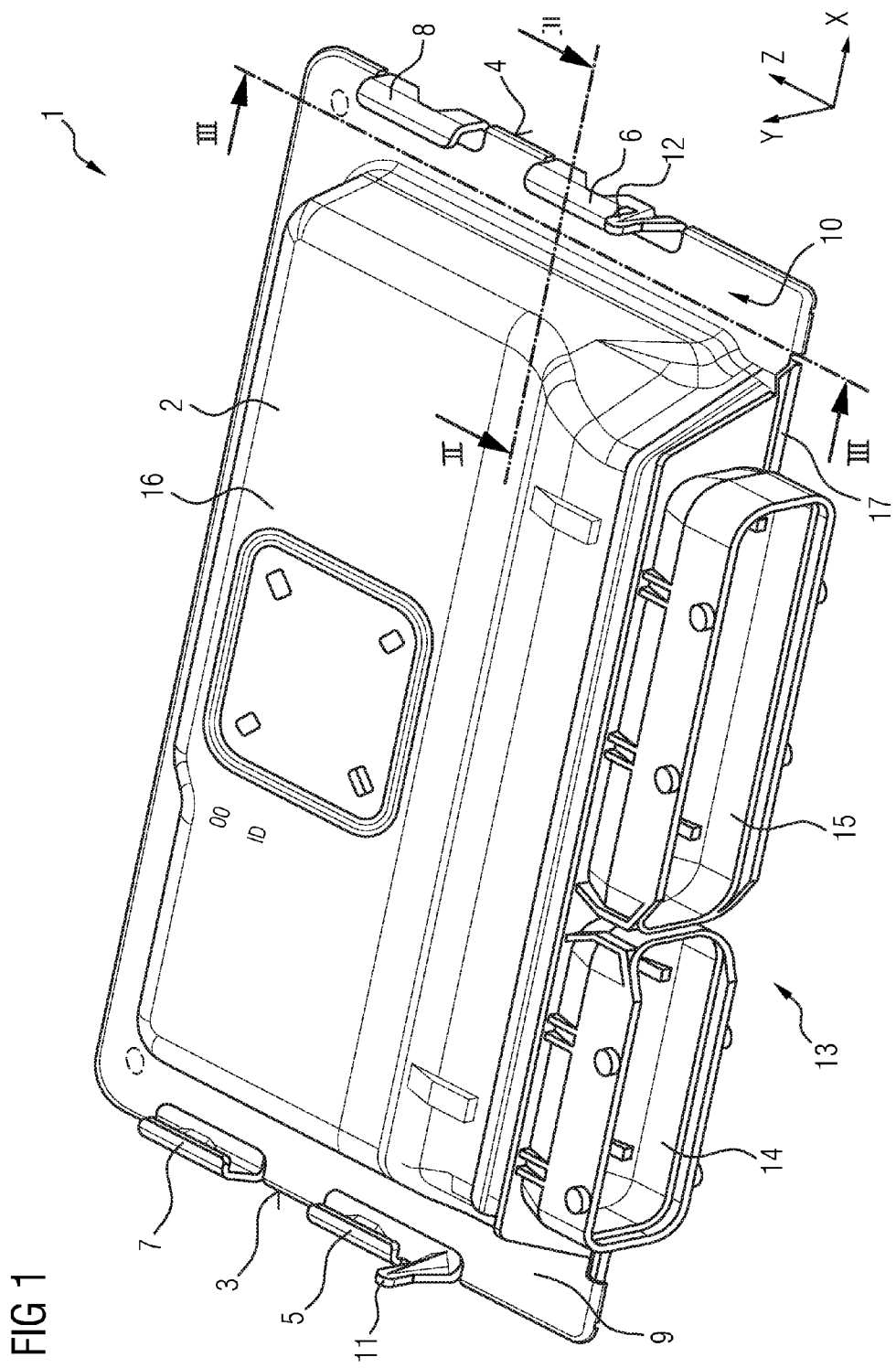
FIG. 1 is a diagrammatic, perspective view of an electronic controlling unit with a housing according to the invention.

Referring now to the figures of the drawings in detail and first, particularly to FIG. 1 thereof, there is shown a perspective view an electronic controlling unit (ECU) with a sheet metal housing 1. The ECU may be used for controlling some functions of a car and is therefore also fixed to a holding element of the car. The housing contains a main body 2, a first housing edge 3 and a second housing edge 4. The first and the second housing edges 3, 4 are arranged at opposite sides of the housing 1. In the shown embodiment the housing has a rectangular basic shape, whereby the first and the second housing edge 3, 4 extend parallel, their common extension direction corresponding to the z-direction in FIG. 1. The first and the second housing edge 3, 4 are aligned in parallel, in FIG. 1 parallel to the z-axis. They span a main extension plane of the housing 1, which is the x-z plane in FIG. 1.

The housing 1 contains a connecting side 13 that is arranged in parallel to the x-y plane in FIG. 1. The connecting side 13 is arranged along a third edge between and connecting the first and the second housing edges 3, 4. The connecting side 13 provides connector openings 14, 15 to receive electrical connectors. At the opposite side of the connecting side 13 of the housing 1 in direction along the first and second housing edges 3, 4 the housing 1 is closed.

In the shown embodiment, the metal housing contains a cover 16 and a base plate 17, the cover being fixed to a base plate 17. Together with the connectors 14, 15, the cover 16 and the base plate 17 constitute the housing 1 and enclose an interior which accommodates a circuit board with electronic components of the electronic controlling unit.

The base plate 17 may have basically a plane shape in the main plane of extension. The cover 16 is formed with a recess that defines a main body 2 of the housing 1 for receiving the electronic controlling unit.

The cover 16 and/or the base plate 17 may be made of sheet metal for example made of steel and/or made of aluminum. Preferably, both the cover 16 and the base plate 17 are sheet metal parts. In this way, the housing 1 may be particularly cost-efficient. For example the base plate 17 is made of sheet aluminum and the cover 16 is made of sheet steel. The cover 16 may have a smaller thickness than the base plate 17, the thickness being in particular the material thickness of the respective sheet. For example the sheet metal of the base plate 17 may have a thickness of 1.5 mm and the sheet metal of the cover 16 may have a thickness of 0.6 mm.

The housing 1 contains, laterally between the first housing edge 3 and the main body 2, a first rim section 9. The housing 1 contains a second rim section 10 laterally between the main body 2 and the second housing edge 4. The first and the second rim sections 9, 10 are constituted by respective coplanar border portions of the cover 16 and the base plate 17 which are preferably in direct mechanical contact, in particular being in full-area contact over the respective border portions. The first and the second rim section 9, 10 have a lower height than the main body 2 and a lower height than a first mounting element 5 or a second mounting element 6. The height is in particular the dimension perpendicular to the main plane of extension. The height of the border portions preferably is the sum of the thicknesses of the metal sheets of the base plate 17 and the cover 16.

The housing 1 contains at the first housing edge 3 the first mounting element 5 and a third mounting element 7. Furthermore a first positioning tab 11 is arranged at the first housing edge 3. Depending on the used embodiment, there may only be arranged the first or the third mounting element 5, 7. Furthermore also the first positioning tab 11 may be omitted. The second housing edge 4 contains the second mounting element 6 and a second positioning tab 12. Furthermore a fourth mounting element 8 is arranged at the second housing edge 4. Depending on the used embodiment, the first, second, third, fourth mounting elements and the first and/or the second positioning tab 11, 12 may be embodied from any material especially from sheet metal. In the present embodiment, the first, second, third, fourth mounting element 5, 6, 7, 8 are embodied in one part with a sheet metal of the housing 1, specifically in one part with a base plate 17 that is embodied as a sheet metal plate of the housing 1.

The first mounting element 5 and the second mounting element 6 may be identical in construction, i.e. they have the same shape and size. Furthermore the third mounting element 7 and the fourth mounting element 8 may also be identical in construction. Depending on the used embodiment, there may only be arranged the second or the fourth mounting element 6, 8 at the second housing edge 4. Referring to the elongation direction of the first and second edges 3, 4, the first and the second mounting element 5, 6 are arranged at the same first length position. Additionally the first and the second positioning tabs 11, 12 are also arranged at the same third length position referring to the longitudinal axis Z. Furthermore the third and the fourth mounting elements 7, 8 are also arranged at the same second length position referring to the longitudinal axis Z.

Furthermore the first and the third mounting element 5, 7 are arranged with their longitudinal axis along one common axis. The second and the fourth mounting element 6, 8 are also arranged with their longitudinal axis along a common second axis. The first and the second axis are arranged in parallel.

Figure 2:
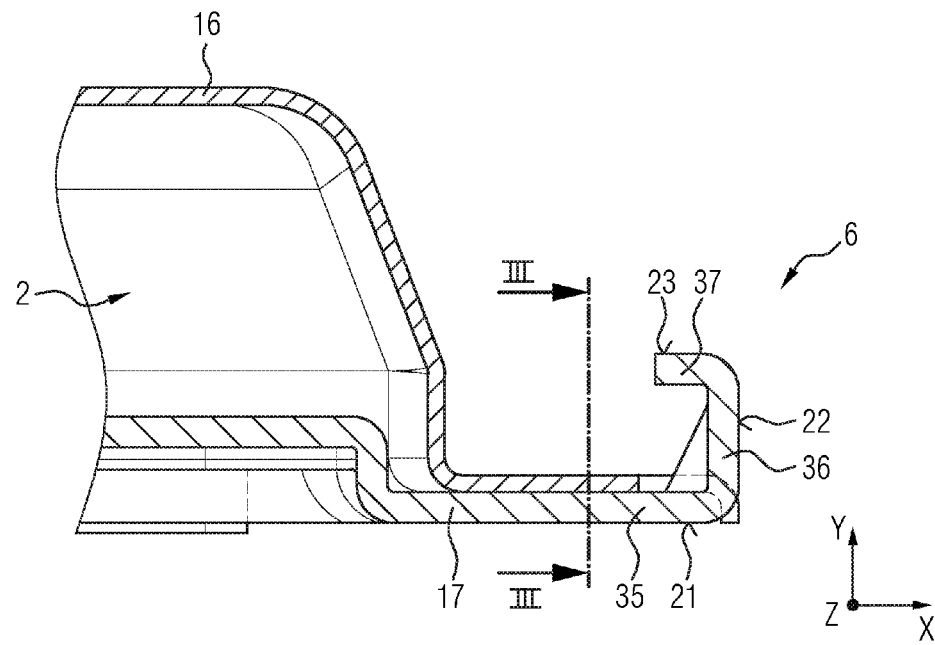
FIG. 2 is a schematic partial cross-sectional view through a mounting element.

FIG. 2 depicts a partial cross-sectional view II-II of FIG. 1 through the second mounting element 6. Between the base plate 17 and the cover 16 the main body 2 is arranged for receiving a circuit board with electronic components of the electronic controlling unit.

The second mounting element 6 is manufactured integrally with the base plate 17. The second mounting element 6 is shaped as a protrusion, protruding from a generally planar main portion of the base plate in direction perpendicular to the common main plane of extension of the housing 1 and the main portion; in FIGS. 1 and 2, this is the y-direction.

The second mounting element 6 contains a first contact face 21, a second contact face 22 and a third contact face 23. The first contact face 21 is arranged at the lower side of the housing 1. The second contact face 22 is arranged at a laterally outer side of the housing 1. The third contact face 23 is arranged at an upper side of the housing 1. The first contact face 21 is arranged in a plane parallel to the z-x plane (perpendicular to the y axis). The second contact face 22 is arranged in a plane parallel to the y-z plane (perpendicular to the x axis). The third contact face 23 is arranged in a plane parallel to the z-x plane (perpendicular to the y axis). In the shown embodiment the first and the third contact face 21, 23 are arranged in parallel. The second contact face 22 is arranged perpendicular to the first and the third contact face 21, 23 and faces away from the first edge 3. Depending on the used embodiment, the first, second and/or third contact face 21, 22, 23 may be arranged in different planes.

The first mounting element 5 is embodied with the same shape as the second mounting element 6 and arranged in mirror-symmetrical fashion thereto with respect to a plane perpendicular to the main plane of extension and parallel to the first and second edges 3, 4. The third and fourth mounting element 7, 8 are also designed in the shown embodiment with the same shape as the second mounting element 6. Therefore the first mounting element 5, the third and fourth mounting elements 7, 8 contain a first contact face 21 at a lower side, a second contact face 22 at an outer side—facing laterally away from the main body 2—and a third contact face 23 at an upper side. Furthermore the first contact face 21 of the second mounting element 6 is arranged at least parallel to the first contact face of the fourth mounting element 8. In the shown embodiment, the first contact face 21 of the second mounting element 6 is arranged in the same plane as the first contact face 21 of the fourth mounting element 8. Also the second contact face 22 of the second mounting element 6 is arranged at least parallel to the second contact face 22 of the fourth mounting element 8. In the shown embodiment, the second contact face 22 of the second mounting element 6 is arranged in the same plane as the second contact face 22 of the fourth mounting element 8. Also the third contact face 23 of the second mounting element 6 is arranged at least in parallel to the third contact face 23 of the fourth mounting element 8. In the shown embodiment, the third contact face 23 of the second mounting element 6 is arranged in the same plane as the third contact face 23 of the fourth mounting element 8.

The first contact face 21 of the first mounting element 5 is arranged at least parallel to the first contact face of the third mounting element 7. In the shown embodiment, the first contact face 21 of the first mounting element 5 is arranged in the same plane as the first contact face 21 of the third mounting element 7. Also the second contact face 22 of the first mounting element 5 is arranged at least parallel to the second contact face 22 of the third mounting element 7. In the shown embodiment, the second contact face 22 of the first mounting element 5 is arranged in the same plane as the second contact face 22 of the third mounting element 7. Also the third contact face 23 of the first mounting element 5 is arranged at least in parallel to the third contact face 23 of the third mounting element 7. In the shown embodiment, the third contact face 23 of the first mounting element 5 is arranged in the same plane as the third contact face 23 of the third mounting element 7.

Each of the mounting elements 5,6,7,8 may be produced by a folding process out of a rim part—in particular adjoining the border portion—of the sheet metal base plate 17, wherein a base section 35 that provides the first contact face is part of the base plate. A side section 36 is folded with a predetermined angle to the base section 35. An upper section 37 that is connected with the side section 36 is also folded with a predetermined angle to the side section 36. In other words, each of the mounting elements may be embodied as a folded lug that is part of the metal base plate 17. In a further embodiment at least one of the mounting elements is at least partially made of other material than the sheet metal to which it is connected. For example at least one of the mounting elements is at least partially made of plastics. For example at least the part of the mounting element that provides the second and/or the third contact face is made of plastics.

Figure 3:
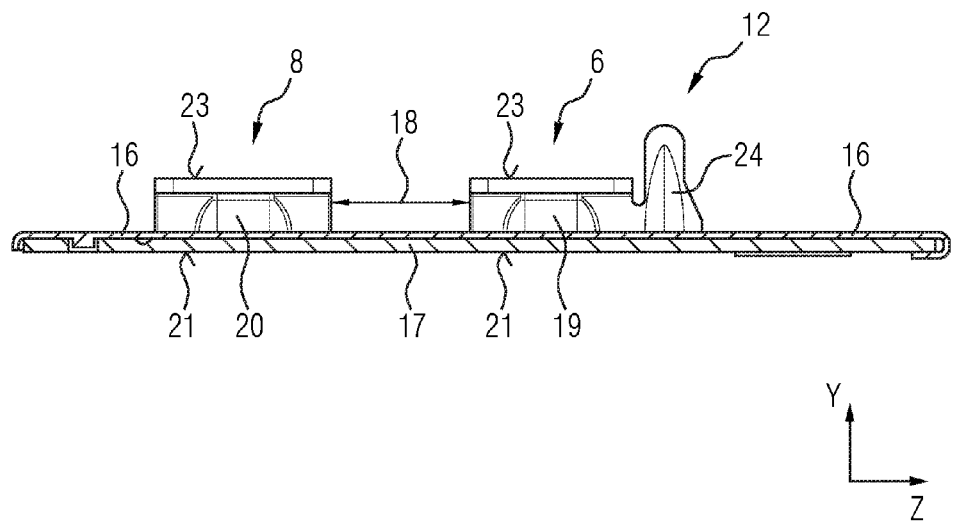
FIG. 3 is a schematic cross-sectional view of a rim of the housing.

FIG. 3 depicts a schematic view along a cross-section III-III of FIG. 2 along the second rim section 10 with a view to the second and fourth mounting element 6, 8. The second positioning tab 12 is also depicted and in this example embodied in one part with the second mounting element 6. The second and fourth mounting elements 6, 8 are positioned with a given distance 18 along the z-axis. Furthermore the first contact faces 21 of the second and fourth mounting elements 6, 8 and the third contact faces 23 of the second and fourth mounting elements 6, 8 are arranged at the same plane. The second positioning tab 12 projects along the y axis above the height of the second and fourth mounting element 6, 8. Depending on the used embodiment, the second positioning tab 12 may have the same or a smaller height than the second and/or the fourth mounting element.

The second mounting element 6 contains a first stiffening 19. The first stiffening 19 is embodiment as a press-in area. Furthermore the fourth mounting element 8 also contains a second stiffening 20. Also the second positioning tab 12 contains a third stiffening 24. The second and third stiffening 20, 24 are also embodied as press-in areas of the sheet metal. The stiffening 19, 20, 24 increase the stability of the second, fourth mounting element 6, 8 and of the second positioning tab 12. Depending on the used embodiment, the stiffening may be omitted.

FIG. 4 depicts a partial perspective view of the first mounting element 5 that is embodied with the same shape as the second mounting element 6 and also contains the stiffening 19. The first positioning tab 11 also contains a third stiffening 24.

FIG. 5 depicts a schematic view of a holding element 25 with the housing 1 being shifted into the holding element 25. The holding element 25 may be embodied to be fixed to a car body. The holding element 25 contain at opposite sides a first and a second side wall 32, 33 with a mounting device 26 to fix the housing 1 to the holding element 25 without using screws. The holding element 25 may be made of plastic. The housing 1 is arranged between the first and the second side walls 32, 33 and fixed to the holding element 25 using the first, second, third, fourth mounting elements and the first and second positioning tabs.

FIG. 6 depicts a cross-sectional view of a part of the second housing edge 4 of the housing 1 through the second mounting element 6. The first side wall 32 of the holding element 25 contains at an inner side a first mounting plane 27, a second mounting plane 28 and a third mounting plane 29. The first mounting plane 27 is arranged perpendicular to the second mounting plane 28. The second mounting plane 28 is arranged perpendicular to the third mounting plane 29. The first and the third mounting plane 27, 29 are arranged in parallel. The distance between the first and the third mounting planes 27, 29 is nearly the same as the distance between the first and the third contact face 21, 23 of the second mounting element 6. The first contact face 21 of the second mounting element 6 lies on the first mounting plane 27. The second contact face 22 of the second mounting element 6 abuts at the second mounting plane 28. The third contact face 23 of the second mounting element 6 abuts at the third mounting plane 29. The first contact face 21 of the fourth mounting element 6 lies on the first mounting plane 27. The second contact face 22 of the fourth mounting element abuts at the second mounting plane 28. The third contact face 23 of the fourth mounting element 6 abuts at the third mounting plane 29.

The second side wall 33 of the holding element 25 contains at an opposite inner side identically constructed first, second and third mounting planes 27, 28, 29 as at the first side wall 32. The first mounting plane is arranged perpendicular to the second mounting plane. The second mounting plane is arranged perpendicular to the third mounting plane. The first and the third mounting plane are arranged in parallel. The distance between the first and the third mounting planes is nearly the same as the distance between the first and the third contact face 21, 23 of the first mounting element 5. The first contact face 21 of the first mounting element 5 lies on the first mounting plane 27. The second contact face 22 of the first mounting element 5 abuts at the second mounting plane 28. The third contact face 23 of the first mounting element 5 abuts at the third mounting plane 29. The first contact face 21 of the third mounting element lies on the first mounting plane 27. The second contact face 22 of the third mounting element abuts at the second mounting plane 28. The third contact face 23 of the third mounting element abuts at the third mounting plane 29. In one embodiment, the first mounting planes of the first and the second side wall are arranged in parallel and preferably in the same z-x plane. The second mounting planes of the first and the second side wall are arranged in parallel and preferably in the same y-z plane. The third mounting planes of the first and the second side wall are arranged in parallel and preferably in the same z-x plane. Depending on the used embodiments, the mounting planes of the first and second side walls are arranged in different planes.

Figure 7:
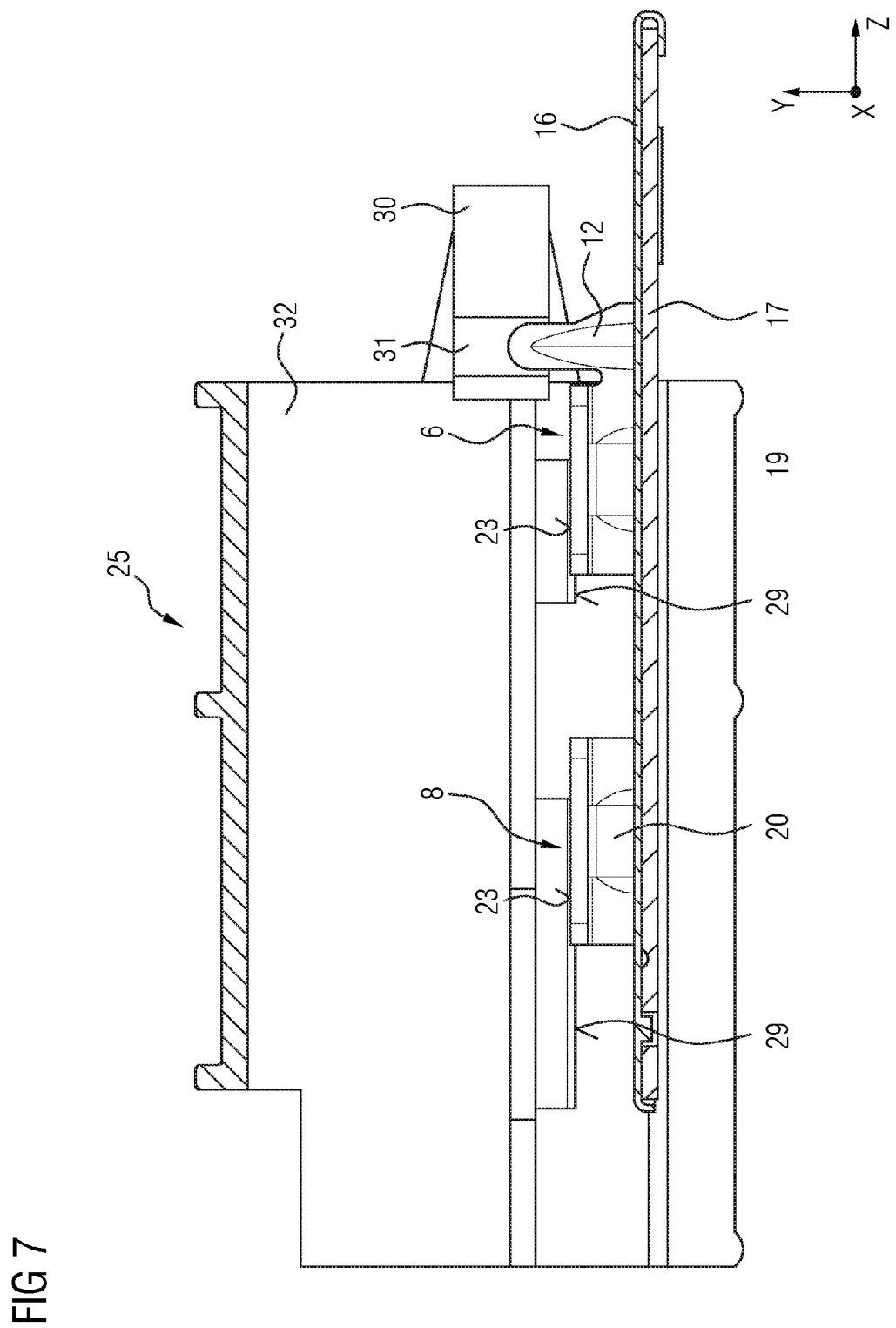
FIG. 7 is a schematic cross-sectional view along a rim of the housing that is mounted at the holding element.

FIG. 7 shows a partial schematic view along the III-III cross-section of the housing 1 that is fixed to the holding element 25 along the second rim section 10 in a z-direction (FIG. 2). The view of FIG. 7 is directed on the second and fourth mounting elements 6, 8 and on the first side wall 32 of the holding element 25.

The first side wall 32 of the holding element 25 contains at a front side a snap arm 30 with a recess 31. The snap arm 30 projects along the z axis from the front side of the first side wall 32. The second positioning tab 12 is arranged within the recess 31 when the housing 1 is shifted into its final position in the holding element 25. The snap arm 30 fixes the second positioning tab 12 by blocking movement in direction along the elongation direction of the first and second edges 3, 4. The snap arm 30 is elastic and can be bent in a x-z plane, i.e. around an axis perpendicular to the main plane of extension and, thus, parallel to the y-axis in FIG. 7. The housing 1 is in this way fixed with respect to a movement along the z axis. A lower face of the snap arm 30 is arranged at a height above the third contact face 23 of the mounting elements 5, 6, 7, 8. Therefore the snap arm 30 does not hinder the pushing of the housing 1 in the holding element 25.

Figure 8:
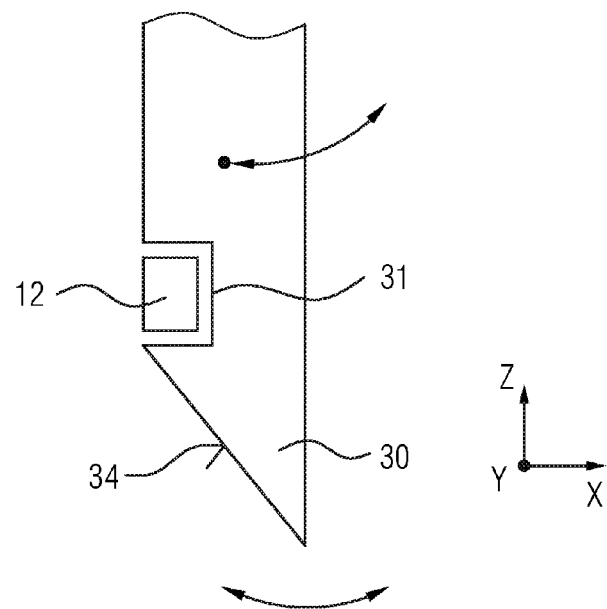
FIG. 8 is a schematic cross-sectional view of a first positioning tab and a snap arm of the holding element.

FIG. 8 depicts a schematic partial view of the snap arm 30 in top view along the y-axis. The second positioning tab 12 is arranged within the recess 31 and fixed by the snap arm 30 against the movement along the z axis. The snap arm 30 is elastic and can be pushed away by the second positioning tab 12 in the x direction to an outer side until the second positioning tab 12 reaches the recess 31 and the snap arm 30 swings back in the rest position as shown in FIG. 8. The snap arm 30 may comprise a guiding face 34 that is arranged with an angle of about 45° with respect to the z axis. The snap arm 30 can also be made of plastic, for example in one part with the first sidewall 32.

For removing the housing 1 from the holding element 25 the two snap arms 30 are pushed in an outer direction freeing the first and the second positioning tab 11, 12. In this situation the housing 1 can be pulled out from the holding element 25.

The holding element 25 comprises two sidewalls 32, 33 that comprise at inner faces mounting means 26 to hold and fix the housing 1.

Figure 9:
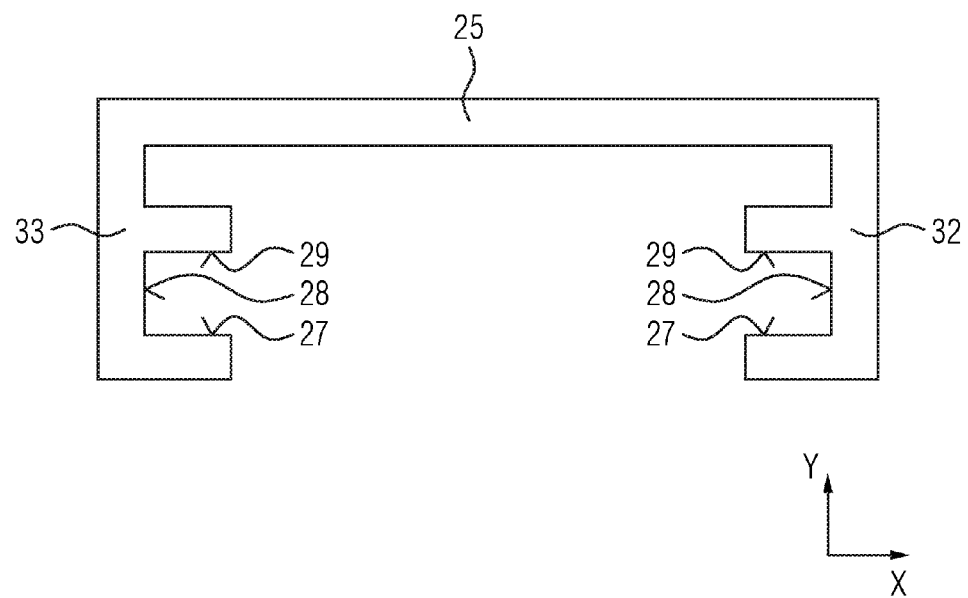
FIG. 9 is a schematic view of the holding element.

FIG. 9 depicts a schematic view of the holding element 25.

The invention claimed is:

1. A sheet metal housing for an electronic controlling unit of a car, the sheet metal housing comprising:
   a first housing edge;
   a second housing edge, the sheet metal housing being fixable in a holding element of the car with said first housing edge and said second housing edge, said first housing edge and said second housing edge are disposed at opposite sides of the sheet metal housing;
   a first mounting element disposed at said first housing edge, said first mounting element containing a first, a second and a third contact face for contacting the holding element to fix the sheet metal housing in the holding element, said first contact face disposed at a lower side of said first mounting element, said second contact face disposed at an outer side of said first mounting element, and said third contact face disposed an upper side opposite to said lower side; and
   a second mounting element disposed at said second housing edge, said second mounting element containing a first, a second and a third contact face for contacting the holding element to fix the sheet metal housing in the holding element, said first contact face of said second mounting element disposed at a lower side of said second mounting element, said second contact face of said second mounting element disposed at an outer side of said second mounting element, and said third contact face of said second mounting element disposed at an upper side opposite to said lower side of said second mounting element.

2. The housing according to claim 1, further comprising:
   a third mounting element disposed at said first housing edge; and
   a fourth mounting element disposed at said second housing edge, said third and said fourth mounting element each contain a first, a second and a third contact face for contacting the holding element to fix the sheet metal housing in the holding element, wherein said first contact faces of said third and fourth mounting elements are disposed at a lower side, wherein said second contact face of said third and fourth mounting elements is disposed at an outer side, wherein said third contact face of said third and fourth mounting elements is disposed at an upper side, and said first and said third mounting elements are disposed by being spaced with a given distance along said first housing edge, and wherein said second and said fourth mounting elements are disposed by being spaced with the given distance along said second housing edge.

3. The housing according to claim 2, wherein:
   said first and second mounting elements are disposed at opposite sides of the sheet metal housing at a same first length position of the sheet metal housing; and
   said third and fourth mounting elements are disposed at opposite sides of the sheet metal housing at a same second length position of the sheet metal housing.

4. The housing according to claim 2, wherein:
   at least one of said first through fourth mounting elements is made of sheet metal; and
   at least one of said first through fourth mounting elements is part of a sheet metal of the sheet metal housing.

5. The housing according to claim 2, wherein at least one of said first through fourth mounting elements has a stiffening formed as a press-in area.

6. The housing according to claim 2, wherein at least one of said first through fourth mounting elements is a folded lug.

7. The housing according to claim 2, wherein:
   said first contact faces of said first and second mounting elements are disposed in parallel, in one plane;
   said second contact faces of said first and second mounting element are disposed in parallel planes; and
   said third contact faces of said first and second mounting element are disposed in parallel, in one plane.

8. The housing according to claim 2, wherein:
   said first contact faces of said first and third mounting element are disposed in parallel, in one plane;
   said second contact faces of said first and third mounting element are disposed in parallel, in one plane; and
   said third contact faces of said first and third mounting elements are disposed in parallel, in one plane.

9. The housing according to claim 2, wherein:
   said first contact faces of said second and fourth mounting elements are disposed in parallel, in one plane;
   said second contact faces of said second and fourth mounting elements are disposed in parallel, in one plane; and
   said third contact faces of said second and fourth mounting elements are disposed in parallel, in one plane.

10. The housing according to claim 1, wherein at least one of said first through fourth mounting elements forms part of a sheet metal base plate.

11. The housing according to claim 10, wherein said first through fourth mounting elements are shaped as protrusions protruding from a generally planar main portion of said sheet metal base plate in a direction perpendicular to a main plane of extension of said main portion.

12. The housing according to claim 10, further comprising a cover made of sheet metal and being fixed to said sheet metal base plate, said cover and said sheet metal base plate constitute the sheet metal housing.

13. The housing according to claim 12, further comprising at least one electric connector.

14. The housing according to claim 1, further comprising a positioning tab disposed at at least one of said first or said second housing edge, said positioning tab projecting above at least one of said first or said second mounting element along a height axis of the sheet metal housing.

15. The housing according to claim 14, wherein said positioning tab is formed in one piece with said first or said second mounting element.

16. The housing according to claim 1, further comprising:
a main body; and
a first and a second rim section disposed between said first and said second mounting element and said main body, said first and said second rim section have a lower height than said main body and said first and second mounting element.

* * * * *